United States Patent
Kim et al.

(10) Patent No.: US 9,640,707 B2
(45) Date of Patent: May 2, 2017

(54) METHOD OF MANUFACTURING SOLAR CELL AND METHOD OF FORMING DOPING REGION

(71) Applicant: LG ELECTRONICS INC., Seoul (KR)

(72) Inventors: Jinsung Kim, Seoul (KR); Daeyong Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 72 days.

(21) Appl. No.: 14/289,172

(22) Filed: May 28, 2014

(65) Prior Publication Data

US 2014/0357008 A1    Dec. 4, 2014

(30) Foreign Application Priority Data

May 28, 2013  (KR) .................. 10-2013-0060557

(51) Int. Cl.
| | | |
|---|---|---|
| *H01L 31/18* | (2006.01) | |
| *H01L 21/265* | (2006.01) | |
| *H01L 21/223* | (2006.01) | |
| *H01L 21/266* | (2006.01) | |
| *H01L 31/068* | (2012.01) | |

(52) U.S. Cl.
CPC ...... *H01L 31/1804* (2013.01); *H01L 21/2236* (2013.01); *H01L 21/266* (2013.01); *H01L 21/26513* (2013.01); *H01L 31/068* (2013.01); *Y02E 10/547* (2013.01); *Y02P 70/521* (2015.11)

(58) Field of Classification Search
CPC .. H01L 21/266; H01L 31/068; H01L 21/2236
See application file for complete search history.

(56) References Cited

U.S. PATENT DOCUMENTS

| | | | |
|---|---|---|---|
| 2009/0142875 A1* | 6/2009 | Borden | H01L 31/022425 438/69 |
| 2011/0139230 A1* | 6/2011 | Rohatgi | H01L 21/263 136/255 |
| 2014/0162395 A1* | 6/2014 | Kim | H01L 31/1804 438/71 |

FOREIGN PATENT DOCUMENTS

JP          06252082        *  9/1994

* cited by examiner

*Primary Examiner* — Daniel Luke
(74) *Attorney, Agent, or Firm* — Birch, Stewart, Kolasch & Birch, LLP

(57) ABSTRACT

A method of manufacturing a solar cell is disclosed. The method includes forming a doping region including first and second portions having different doping concentrations by ion-implanting a dopant into a semiconductor substrate and forming an electrode connected to the doping region. In the forming of the doping region, the first and second portions are simultaneously formed by the same process using a mask that is disposed at a distance from the semiconductor substrate.

16 Claims, 8 Drawing Sheets

METHOD OF MANUFACTURING SOLAR CELL AND METHOD OF FORMING DOPING REGION

CROSS-REFERENCE TO RELATED APPLICATION

This application claims the priority benefit of Korean Patent Application No. 10-2013-0060557, filed on May 28, 2013 in the Korean Intellectual Property Office, the disclosure of which is incorporated herein by reference.

BACKGROUND OF THE INVENTION

1. Field of the Invention

Embodiments relate to a method of manufacturing a solar cell and a method of forming a doping region and, more particularly, to methods of manufacturing a solar cell and forming a doping region that are performed by improved manufacturing processes.

2. Description of the Related Art

Recently, as existing energy resources such as petroleum and coal are running out, interest in alternative energy sources is increasing. In particular, solar cells, which directly convert solar energy into electric energy, are receiving much attention as a next-generation energy source.

Solar cells may be classified as a silicon solar cell, a compound solar cell, a dye-sensitized solar cell, a thin film solar cell, and the like. These solar cells may be manufactured by forming various layers and electrodes according to design. Due to formation of various layers and electrodes, problems, such as complicated solar cell manufacturing processes, deterioration of solar cell characteristics during various manufacturing processes, and the like, may occur.

SUMMARY OF THE INVENTION

Embodiments of the invention provide methods of manufacturing a solar cell and forming a doping region that may maintain excellent characteristics and be performed by simplified manufacturing processes.

In one embodiment of the invention, a method of manufacturing a solar cell includes forming a doping region including first and second portions having different doping concentrations by ion-implanting a dopant into a semiconductor substrate and forming an electrode connected to the doping region. In the forming of the doping region, the first and second portions are simultaneously formed by the same process using a mask that is disposed at a distance from the semiconductor substrate.

In another embodiment of the invention, there is provided a method of forming a doping region of a solar cell, including simultaneously forming first and second portions having different doping concentrations by ion-implanting a dopant into a semiconductor substrate by the same process using a mask that is disposed at a distance from the semiconductor substrate.

In the embodiments of the invention, the first and second portions having different doping concentrations may be formed through a single ion implantation. Thus, production costs may be reduced and damage to the semiconductor substrate 110 that may occur during ion implantation may be minimized when compared to a conventional method of forming first and second portions by separate doping processes. Accordingly, a solar cell manufactured using the method described above may have enhanced characteristics and productivity.

BRIEF DESCRIPTION OF THE DRAWINGS

Details of the embodiments of the invention will be more clearly understood from the following detailed description taken in conjunction with the accompanying drawings, in which.

DETAILED DESCRIPTION OF EMBODIMENTS

Figure 1:
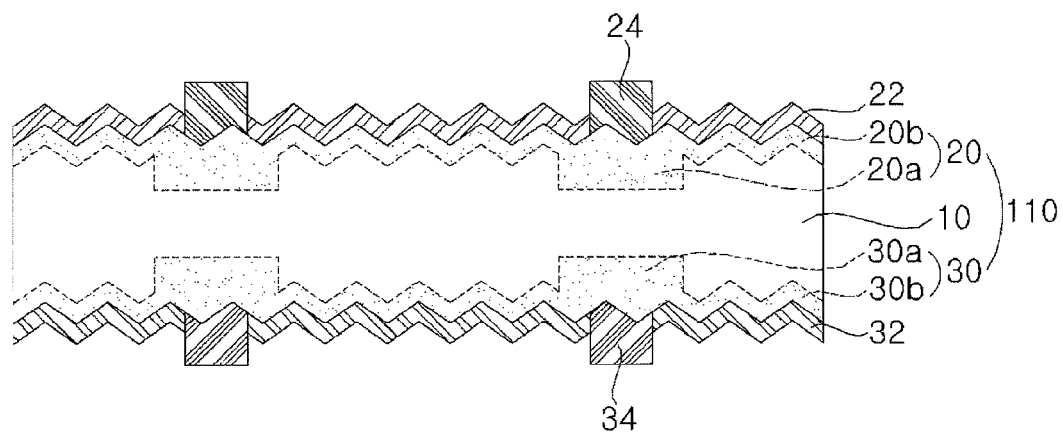
FIG. 1 is a sectional view of a solar cell according to an embodiment of the invention.

Reference will now be made in detail to embodiments of the invention, examples of which are illustrated in the accompanying drawings. However, the invention may be embodied in many different forms and should not be construed as limited to the embodiments of the invention set forth herein.

Only elements constituting features of the embodiments of the invention are illustrated in the accompanying drawings and other elements that will not be described herein are omitted from the drawings, for clarity of description. Like reference numerals refer to like elements throughout. In the drawings, the thicknesses, areas, etc. of constituent elements may be exaggerated or reduced for clarity and convenience of illustration. The embodiments of the invention are not limited to the illustrated thicknesses, areas, etc.

It will be further understood that, throughout this specification, when one element is referred to as "comprising" another element, the term "comprising" specifies the presence of another element but does not preclude the presence of other additional elements, unless context clearly indicates otherwise. In addition, it will be understood that when one element such as a layer, a film, a region or a plate is referred to as being "on" another element, the one element may be directly on the another element, and one or more intervening elements may also be present. In contrast, when one element such as a layer, a film, a region or a plate is referred to as being "directly on" another element, no intervening elements are present.

Hereinafter, a solar cell according to an embodiment of the invention and a method of manufacturing the same will be described in detail with reference to the accompanying drawings.

Figure 2:
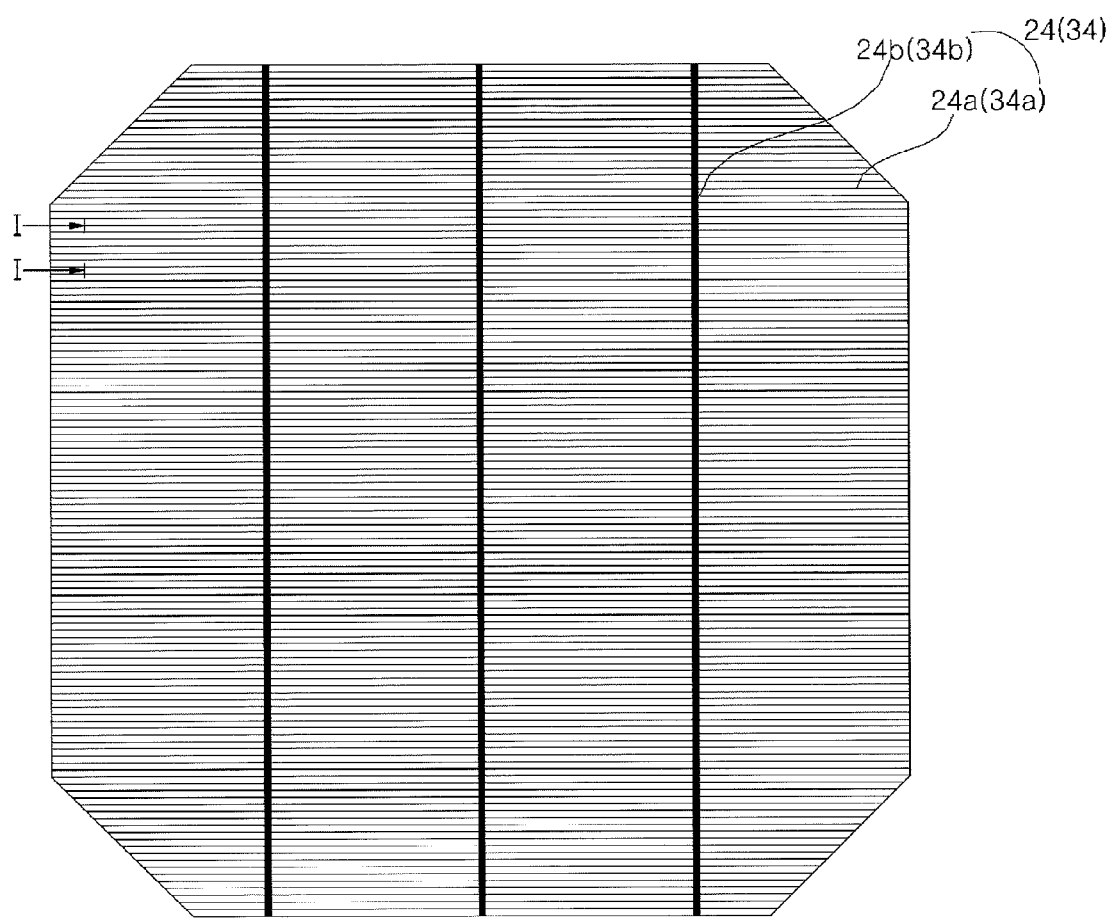
FIG. 2 is a plan view of the solar cell according to the embodiment of the invention.

FIG. 1 is a sectional view of a solar cell 100 according to an embodiment of the invention. FIG. 2 is a plan view of the solar cell 100 according to the embodiment of the invention. For reference, FIG. 1 is a sectional view taken along line I-I of FIG. 2.

Referring to FIGS. 1 and 2, the solar cell 100 according to the embodiment of the invention may include a substrate 110 (e.g., a semiconductor substrate, hereinafter referred to as "semiconductor substrate"), doping regions 20 and 30 formed at the semiconductor substrate 110, and electrodes 24 and 34 electrically connected respectively to the doping regions 20 and 30. The doping regions 20 and 30 may include an emitter region 20 and a back surface field region 30, and the electrodes 24 and 34 may include first electrodes 24 electrically connected to the emitter region 20 and second electrodes 34 electrically connected to the back surface field region 30. The solar cell 100 may further include an anti-reflective film 22, a passivation film 32, and the like. Hereinafter, these elements will be described in detail.

The semiconductor substrate 110 includes regions in which the doping regions 20 and 30 are formed and a region in which the doping regions 20 and 30 are not formed, i.e., a base region 10. The base region 10 may be formed of a crystalline semiconductor including a first conductive type dopant. For example, the base region 10 may be formed of a mono-crystalline or polycrystalline semiconductor (e.g., mono-crystalline or polycrystalline silicon) including a first conductive type dopant. In particular, the base region 10 may be formed of a mono-crystalline semiconductor (e.g., a mono-crystalline semiconductor wafer, more particularly a silicon wafer) including a first conductive type dopant. As such, when the base region 10 is formed of a mono-crystalline semiconductor (e.g., mono-crystalline silicon), the solar cell 100 is embodied as a mono-crystalline semiconductor solar cell (e.g., a mono-crystalline silicon solar cell). The solar cell 100 including the base region 10 or the semiconductor substrate 110 that has high crystallinity and thus fewer defects has excellent electrical characteristics.

When the base region 10 having an n-type dopant is used, the emitter region 20 having a p-type dopant is formed at a first surface (hereinafter referred to as "a front surface") of the semiconductor substrate 110 to form a pn junction. When the pn junction is irradiated with light, electrons generated by the photoelectric effect move towards a second surface (hereinafter referred to as "a back surface") of the semiconductor substrate 110 and are collected by the second electrodes 34, and holes move towards the front surface of the semiconductor substrate 110 and are collected by the first electrodes 24. Through this process, electrical energy is generated. In this regard, holes which move more slowly than electrons move towards the front surface of the semiconductor substrate 110, not towards the back surface thereof, whereby conversion efficiency may be enhanced. However, the embodiments of the invention are not limited to the above examples, and the base region 10 and the back surface field region 30 may be of a p-type and the emitter region 20 may be of an n-type.

At least one of the front and back surfaces of the semiconductor substrate 110 may be textured to have an uneven portion in the form of a pyramid, or other shaped protrusions, or the like. Through the texturing process, the uneven portion is formed at the front or back surface of the semiconductor substrate 10 and thus surface roughness thereof increases, whereby reflectance of light incident on the front or back surface of the semiconductor substrate 10 may be reduced. Accordingly, the amount of light reaching the pn junction formed at an interface between the semiconductor substrate 110 and the emitter region 20 may be increased and, consequently, light loss may be minimized.

The emitter region 20 having a second conductive type dopant may be formed at the front surface of the semiconductor substrate 110. In the embodiment of the invention, as the second conductive type dopant of the emitter region 20, a p-type dopant such as a Group III element, e.g., boron (B), aluminum (Al), gallium (Ga), indium (In), or the like, may be used. The emitter region 20 may be formed using various methods such as thermal diffusion, ion implantation, or the like.

The emitter region 20 according to the embodiment of the invention includes a doping region formed by doping the semiconductor substrate 110 with a second conductive type dopant. Accordingly, the emitter region 20 may be formed of a crystalline semiconductor including a second conductive type dopant. For example, the emitter region 20 may be formed of a mono-crystalline or polycrystalline semiconductor (e.g., mono-crystalline or polycrystalline silicon) including a second conductive type dopant. In particular, the emitter region 20 may be formed of a mono-crystalline semiconductor (e.g., a mono-crystalline semiconductor wafer, more particularly a silicon wafer) including a second conductive type dopant. As such, the emitter region 20 partially constitutes the semiconductor substrate 110 and thus the emitter region 20 and the base region 10 have the same crystal structure, whereby adhesion characteristics may be enhanced.

In the embodiment of the invention, the emitter region 20 may include first portions 20a having a high doping concentration and thus having a relatively low resistance and second portions 20b having a low doping concentration and thus having a relatively high resistance. Each of the first portions 20a is configured to partially or completely (i.e., at least partially) contact the first electrodes 24.

As such, in the embodiment of the invention, each of the second portions 20b having a relatively high resistance is formed at a portion corresponding to a region between the first electrodes 24 through which light is incident, thereby obtaining a shallow emitter. Accordingly, current density of the solar cell 100 may be increased. In addition, the first portions 20a having a relatively low resistance are respectively formed adjacent to the first electrodes 24, thereby reducing contact resistance thereof with the first electrodes 24. That is, the emitter region 20 has a selective structure and thus the solar cell 100 may have maximized efficiency.

The emitter region 20 may be formed using various methods, e.g., ion implantation. In the embodiment of the invention, the emitter region 20 having the selective structure described above may be formed by a single ion implantation process. This will be described below in further detail.

On the semiconductor substrate 110, more particularly on the emitter region 20 on the semiconductor substrate 110, is formed the anti-reflective film 22 and the first electrodes 24.

The anti-reflective film 22 may be formed on substantially the entire surface of the semiconductor substrate 110, not on regions of the front surface of the semiconductor substrate 110 on which the first electrodes 24 are formed. The anti-reflective film 22 reduces reflectance of light incident on the front surface of the semiconductor substrate 110 and inactivates defects present at the surface or bulk of the emitter region 20.

The amount of light reaching the pn junction formed at an interface between the semiconductor substrate 110 and the emitter region 20 may be increased by reducing the reflectance of light incident through the front surface of the semiconductor substrate 110. Accordingly, short-circuit current Isc of the solar cell 100 may be increased. In addition, an open circuit voltage Voc of the solar cell 100 may be increased by removing recombination sites of minority carriers through inactivation of defects present in the emitter region 20. As such, efficiency of the solar cell 100 may be enhanced by increasing the open circuit voltage Voc and short-circuit current Isc of the solar cell 100 by the anti-reflective film 22.

The anti-reflective film 22 may be formed of various materials. For example, the anti-reflective film 22 may be any one film selected from the group consisting of a silicon nitride film, a hydrogen-containing silicon nitride film, a silicon oxide film, a silicon oxynitride film, an aluminum oxide film, a $MgF_2$ film, a ZnS film, a $TiO_2$ film, and a $CeO_2$ film or have a multilayer structure including two or more of the above-listed films in combination. However, the embodiments of the invention are not limited to the above examples and the anti-reflective film 22 may include various other materials. In addition, a separate front surface passivation film (not shown) may further be formed between the semiconductor substrate 110 and the anti-reflective film 22. This is also within the scope of the embodiments of the invention.

The first electrodes 24 are electrically connected to the emitter region 20 via openings formed in the anti-reflective film 22 (i.e., through the anti-reflective film 22). The first electrodes 24 may be formed of various materials so as to have various shapes. The structure of the first electrodes 24 will be described below in detail.

The back surface field region 30 including a first conductive type dopant at a higher doping concentration than the semiconductor substrate 110 is formed at the back surface of the semiconductor substrate 110. In the embodiment of the invention, the back surface field region 30 may use an n-type dopant as the first conductive type dopant, for example, a Group V element such as phosphorus (P), arsenic (As), bismuth (Bi), antimony (Sb), or the like. The back surface field region 30 may be formed using various methods, such as thermal diffusion, ion implantation, or the like.

The back surface field region 30 according to the embodiment of the invention includes a doping region formed by doping the semiconductor substrate 110 with a first conductive type dopant. Accordingly, the back surface field region 30 may be formed of a crystalline semiconductor including a first conductive type dopant so as to have a higher doping concentration than the base region 10. For example, the back surface field region 30 may be formed of a mono-crystalline or polycrystalline semiconductor (e.g., mono-crystalline or polycrystalline silicon) including a first conductive type dopant. In particular, the back surface field region 30 may be formed of a mono-crystalline semiconductor (e.g., a mono-crystalline semiconductor wafer, more particularly a silicon wafer) including a first conductive type dopant. As such, the back surface field region 30 partially constitutes the semiconductor substrate 110 and thus the back surface field region 30 and the base region 10 have the same crystal structure, whereby effects of the back surface field region 30 may be maximized.

Meanwhile, in the embodiment of the invention, the back surface field region 30 may have a selective structure. That is, in particular, the back surface field region 30 may include first portions 30a adjacent to (e.g., contacting) the second electrodes 34 and the second portions 30b formed in at least regions in which the second electrodes 34 are not formed. The first portions 30a have a higher doping concentration thus having a lower resistance than the second portions 30b, and the second portions 30b have a relatively lower doping concentration thus having a relatively higher resistance.

As such, in the embodiment of the invention, each of the second portions 30b having a relatively high resistance is formed at a portion corresponding to a region between the second electrodes 34 and thus recombination between holes and electrons may be effectively prevented or reduced. Accordingly, current density of the solar cell 100 may be enhanced. In addition, each of the first portions 30a having a relatively low resistance is formed at a portion adjacent to the second electrode 34 (in particular, a plurality of finger electrodes 34a constituting the second electrodes 34) and thus contact resistance with the second electrodes 34 may be reduced. That is, the back surface field region 30 according to the embodiment of the invention may maximize efficiency of the solar cell 100 by a selective back surface field structure.

The back surface field region 30 may be formed using various methods, e.g., ion implantation. In the embodiment of the invention, the back surface field region 30 having the selective structure described above may be formed through a single ion implantation. This will be described below in more detail.

The passivation film 32 and the second electrodes 34 may be formed on the back surface of the semiconductor substrate 110.

The passivation film 32 may be formed substantially over the entire back surface of the semiconductor substrate 110, not on portions in which the second electrodes 34 are formed. The passivation film 32 may remove recombination sites of minority carriers by inactivating defects present in the back surface of the semiconductor substrate 110. Accordingly, the open circuit voltage of the solar cell 100 may be increased.

The passivation film 32 may be formed of a transparent insulating material so as to allow light to pass therethrough. Thus, light may be incident through the back surface of the semiconductor substrate 110 by the passivation film 32 and, accordingly, efficiency of the solar cell 100 may be enhanced. That is, the solar cell 100 according to the embodiment of the invention may be a bifacial light-receiving type solar cell through opposite surfaces of which light can be received. However, the embodiments of the invention are not limited to the above examples and the solar cell may be variously modified.

For example, the passivation film 32 may be any one film selected from the group consisting of a silicon nitride film, a hydrogen-containing silicon nitride film, a silicon oxide film, a silicon oxynitride film, an aluminum oxide film, a $MgF_2$ film, a ZnS film, a $TiO_2$ film, and a $CeO_2$ film or have a multilayer structure including two or more of the above-listed films in combination. However, the embodiments of the invention are not limited to the above examples and the passivation film 32 may include various other materials.

The second electrodes 34 are electrically connected to the back surface field region 30 through the openings formed in the passivation film 32 (i.e., through the passivation film 32). The second electrodes 34 may be formed to have various shapes.

The first and second electrodes 24 and 34 according to the embodiment of the invention may have various planar shapes.

Referring to FIG. 2, the first and second electrodes 24 and 34 may respectively include a plurality of finger electrodes 24a and a plurality of finger electrodes 34a that have a certain pitch and are spaced apart from one another. Although FIG. 2 illustrates that the finger electrodes 24a or 34a are parallel to each other and parallel to an edge of the semiconductor substrate 110, the embodiments of the invention are not limited to the above example. In addition, the first or second electrode 24 or 34 may include bus bar electrodes 24b or 34b that are formed in a direction crossing the finger electrodes 24a or 34a and that connect the finger electrodes 24a or 34a to one another. In this regard, a single bus bar electrode 24b or 34b may be provided or, as illustrated in FIG. 2, plural bus bar electrodes 24b or 34b each having a greater pitch than the finger electrodes 24a or 34a may be provided. The bus bar electrodes 24b and 34b may have a greater width than the finger electrodes 24a and 34a, respectively. However, the embodiments of the invention are not limited to the above examples and the bus bar electrodes 24b and 34b may have the same or smaller width than the finger electrodes 24a and 34a, respectively.

As seen in a sectional view, the finger electrodes 24a and 34a and the bus bar electrodes 24b and 34b may be formed through the anti-reflective film 22 or the passivation film 32. In another embodiment of the invention, the finger electrodes 24a and 34a may be formed through the anti-reflective film 22 or the passivation film 32 and the bus bar electrodes 24b and 34b may be formed on the anti-reflective film 22 or the passivation film 32.

The first portions 20a of the emitter region 20 may be formed at portions corresponding to at least the finger electrodes 24a and further include portions corresponding to the bus bar electrodes 24b. Similarly, the first portions 30a of the back surface field region 30 may be formed at portions corresponding to at least the finger electrodes 34a and further include portions corresponding to the bus bar electrodes 34b.

In the drawings and the foregoing description, the first and second electrodes 24 and 34 have the same shape. However, the embodiments of the invention are not limited to the above example and the first and second electrodes 24 and 34 may have different shapes, and the finger electrodes 24a and 34a and the bus bar electrodes 24b and 34b may have different widths and pitches. In addition, other modifications are possible.

As described above, in the embodiment of the invention, the emitter region 20 and the back surface field region 30 may be formed through a single ion implantation. This will be described below in further detail with reference to FIGS. 3A to 3E.

FIGS. 3A to 3E are sectional views illustrating a solar cell manufacturing method according to an embodiment of the invention.

Figure 3A:
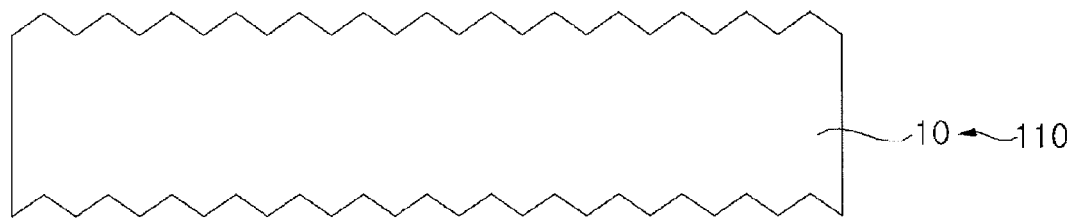
FIGS. 3A to 3E are sectional views illustrating a solar cell manufacturing method according to an embodiment of the invention.

As illustrated in FIG. 3A, the semiconductor substrate 110 including the base region 10 having a first conductive type dopant is prepared. In the embodiment of the invention, the semiconductor substrate 110 may be formed of silicon having an n-type or p-type dopant. As the n-type dopant, a Group V element, such as P, As, Bi, Sb, or the like, may be used. As the p-type dopant, a Group III element, such as B, Al, Ga, In, or the like, may be used.

In this regard, the semiconductor substrate 110 on which necessary pre-treatment (e.g., saw etching), texturing, and the like have been completed is prepared. Texturing of the front surface and/or the back surface of the semiconductor substrate 110 may be performed by wet texturing or dry texturing. Wet texturing may be performed by immersing the semiconductor substrate 110 in a texturing solution and is advantageous in that manufacturing time is short. Dry texturing is carried out by cutting a surface of the semiconductor substrate 110 using a diamond drill, a laser or the like. In dry texturing, irregularities may be uniformly formed, while manufacturing time is long and damage to the semiconductor substrate 110 may occur. In addition, the semiconductor substrate 110 may be textured by reactive ion etching (RIE) or the like. As such, in the embodiments of the invention, the semiconductor substrate 110 may be textured using various methods. In addition, the back surface of the semiconductor substrate 110 may be treated by known mirror surface polishing.

Figure 3B:
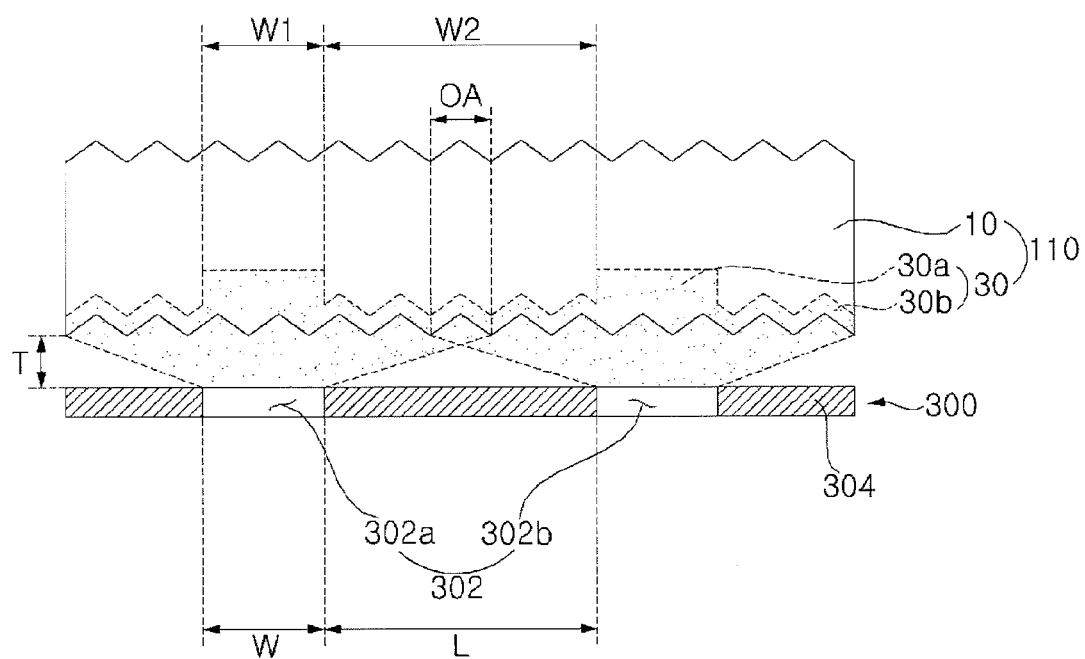
Figure 3C:
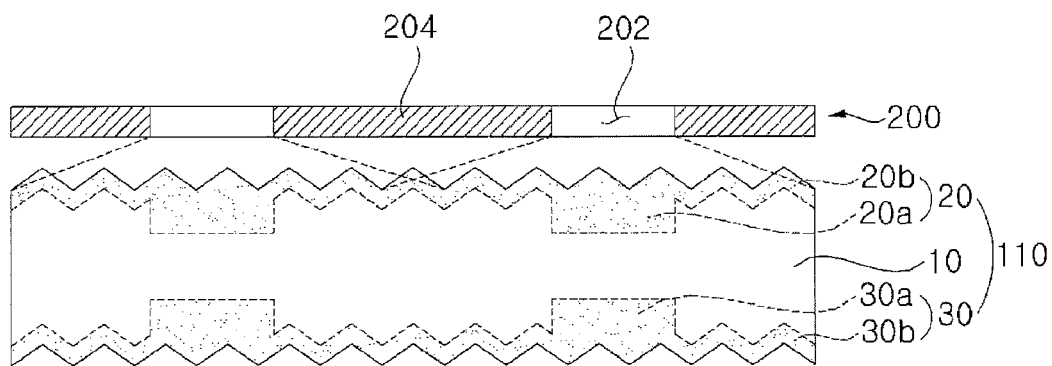

Subsequently, as illustrated in FIGS. 3B and 3C, the back surface field region 30 having a selective structure is formed at the back surface of the semiconductor substrate 110, and the emitter region 20 having a selective structure is formed at the front surface of the semiconductor substrate 110. This will be described below in more detail.

As illustrated in FIG. 3B, a first conductive type dopant is ion-implanted into the back surface of the semiconductor substrate 110 in a state in which a mask 300 is disposed by a certain distance T apart therefrom. The mask 300 may have various structures and types. For example, a shadow mask may be used as the mask 300.

In this regard, in the embodiment of the invention, the first and second portions 30a and 30b that have different doping concentrations may be simultaneously formed by performing a single ion implantation by adjusting the distance T between the semiconductor substrate 110 and the mask 300 or adjusting ion implantation energy. More particularly, when the distance T between the semiconductor substrate 110 and the mask 300 decreases, it is difficult for ions to spread wide and thus ion implantation may be concentrated at portions corresponding to openings 302 of the mask 300. On the other hand, when the distance T between the semiconductor substrate 110 and the mask 300 increases, ions spread wide and thus may be implanted into a wide region. In addition, as ion implantation energy increases, linearity of ions increases and thus ion implantation may be concentrated at the portions corresponding to the openings 302 of the mask 300. On the other hand, as ion implantation energy decreases, linearity of ions decreases and thus ions may spread wide and be implanted into a wide region.

In the embodiment of the invention, ion implantation energy, the distance T between the semiconductor substrate 110 and the mask 300, and width W and pitch L of the openings 302 of the mask 300 are adjusted so that ions spread to portions of the semiconductor substrate 110 that correspond to cover parts 304 of the mask 300. That is, when a distance L between a first opening 302a and a second opening 302b that are adjacent to each other is denoted as a first distance 1, ions having passed through the first and second openings 302a and 302b may be implanted into the semiconductor substrate 110 by spreading outside of (or spreading out from) the first and second openings 302a and 302b by half the first distance 1 (i.e., 0.51) to the first distance 1 while moving towards the semiconductor substrate 110. Accordingly, undoped portions are not formed at the portions of the semiconductor substrate 110 that correspond to the cover parts 304, and portions of the semiconductor substrate 110 that correspond to other openings 202 may be unaffected.

In this regard, a large amount of ions having passed through the first and second openings 302a and 302b is implanted into portions of the semiconductor substrate 110 that correspond to the first and second openings 302a and 302b. Accordingly, the first portions 30a, having a relatively high doping concentration, are formed at the portions corresponding to the first and second openings 302a and 302b. In addition, the ions having passed through the first and second openings 302a and 302b are partially implanted into the portions of the semiconductor substrate 110 that correspond to the cover parts 304 by spreading outside of the first and second openings 302a and 302b. The amount of ions spreading outside of the first and second openings 302a and 302b is smaller than the amount of ions moving towards the semiconductor substrate 110 corresponding to the first and second openings 302a and 302b and thus the second portions 30b having a relatively low doping concentration are formed at the portions of the semiconductor substrate 110 corresponding to the cover parts 304.

In this regard, ions having passed through the first opening 302a and ions having passed through the second opening 302b may be implanted by overlapping with each other at a position corresponding to the cover part 304 disposed between the first and second openings 302a and 302b. That is, the portion corresponding to the cover part 304 may have an overlapping area OA into which the ions having passed through the first opening 302a and the ions having passed through the second opening 302b are implanted together. When the overlapping area OA is formed, undoped portions may not remain at the portions of the semiconductor substrate 110 corresponding to the cover parts 304 even though errors and the like of manufacturing processes occur. However, the embodiments of the invention are not limited to the above examples and the overlapping area OA may be omitted.

For this, for example, ion implantation energy may be 3 KeV to 20 KeV. When the ion implantation energy is less than 3 KeV, ion implantation may not be smoothly performed. On the other hand, when the ion implantation energy exceeds 20 KeV, linearity of ions becomes high and thus undoped portions may remain at the portions of the semiconductor substrate 110 corresponding to the cover parts 304. In this regard, to further effectively prevent formation of undoped portions, ion implantation energy may be 3 KeV to 10 KeV.

In this regard, ion implantation is performed using plasma ion implantation. In plasma ion implantation, the semiconductor substrate 110 is introduced into a plasma chamber and a higher voltage (e.g., a negative voltage) is repeatedly applied to the semiconductor substrate 110 than a grounded vacuum chamber wall. While a high voltage pulse is applied to the semiconductor substrate 110, a plasma sheath is formed therearound and thus ions having energy corresponding to the applied voltage are implanted into the semiconductor substrate 110. In such plasma ion implantation, ion implantation energy may be significantly reduced using plasma and thus ion implantation may be performed by ion implantation energy within the above-described range.

In addition, the distance T between the semiconductor substrate 110 and the mask 300 may, for example, be 4 mm to 8 mm. When the distance T between the semiconductor substrate 110 and the mask 300 is less than 4 mm, it is difficult for ions to spread wide and thus undoped portions may be formed at the portions of the semiconductor substrate 110 corresponding to the cover parts 304. On the other hand, when the distance T between the semiconductor substrate 110 and the mask 300 exceeds 8 mm, an overall amount of ions implanted into the semiconductor substrate 110 is reduced and thus doping quality may be deteriorated. However, the embodiments of the invention are not limited to the above examples and the distance T may vary according to the size of the semiconductor substrate 110, doping concentration of the doping region 30, and the like.

In this regard, the width W of the opening 302 may be less than or equal to the distance L between the openings 302 (i.e., the width of the cover part 304). This is intended to enhance structural stability of the mask 300 and to maintain a difference in doping concentration between the first and second portions 30a and 30b to a certain level or higher.

For example, a ratio (W/L) of the width W of the opening 302 to the distance L between the openings 302 may be 0.18 to 1.00. When the ratio (W/L) is less than 0.18, the width W of the opening 302 is small and the distance L between the openings 302 is large and thus it may be difficult for ions having passed through the openings 302 to entirely reach the portions of the semiconductor substrate 110 corresponding to the cover parts 304. Thus, undoped portions may be formed at the portions of the semiconductor substrate 110 corresponding to the cover parts 304. On the other hand, when the ratio (W/L) exceeds 1.00, the width W of the opening 302 is large and the distance L between the openings 302 is small and thus the amount of dopant implanted into the portions of the semiconductor substrate 110 corresponding to the cover part 304 may increase. Thus, a boundary between the first portion 30a having a high doping concentration and the second portion 30b having a low doping concentration may be unclear. Accordingly, it is difficult to form the back surface field region 30 having a selective structure. In this regard, to more clearly form the boundary between the first and second portions 30a and 30b and to form the first and second portions 30a and 30b without undoped portions, the ratio (W/L) may be 0.25 to 0.428.

For example, the width W of the openings 302 formed in the mask 300 may be 150 nm to 500 nm and the distance L between the openings 302 may be 500 nm to 850 nm. When the width W of the openings 302 is less than 150 nm or the distance L between the openings 302 exceeds 850 nm, undoped portions may be formed at the portions of the semiconductor substrate 110 corresponding to the cover parts 304. When the width W of the openings 302 exceeds 500 nm or the distance L between the openings 302 is less than 500 nm, the boundary between the first and second portions 30a and 30b may be unclear. In this regard, to clearly form the boundary between the first and second portions 30a and 30b and to form the first and second portions 30a and 30b without undoped portions, the width W of the openings 302 may be 200 nm to 300 nm and the distance L between the openings 302 may be 700 nm to 800 nm.

The width W of the openings 302 is inversely proportional to the distance T between the semiconductor substrate 110 and the mask 300. That is, when the width W of the openings 302 is relatively small, the distance T between the semiconductor substrate 110 and the mask 300 may be relatively large in order for ions to spread wide. When the width W of the openings 302 is relatively large, the distance T between the semiconductor substrate 110 and the mask 300 may be relatively small in order for ions to spread wide.

As such, in the embodiment of the invention, the first and second portions 30a and 30b that have different doping concentrations may be simultaneously formed through a single ion implantation by limiting ion implantation energy, the distance T between the semiconductor substrate 110 and the mask 300, the width W of the openings 302, and the distance L between the openings 302 in the ion implantation process. Thus, production costs may be reduced and damage to the semiconductor substrate 110 that may occur during ion implantation may be minimized when compared to a conventional method of forming the first and second portions by separate doping processes.

The first portions 30a formed by such ion implantation may have a doping concentration of $2.0 \times 10^{19}/cm^3$ to $5.0 \times 10^{19}/cm^3$ and a width W1 of 300 nm to 700 nm. The second portions 30b may have a doping concentration of $1.0 \times 10^{19}/cm^3$ to $2.0 \times 10^{19}/cm^3$ (or $1.0 \times 10^{18}/cm^3$ to less than $2.0 \times 10^{19}/$ cm$^3$) and a width W2 of 300 nm to 700 nm. More particularly, the width W1 of the first portions 30a may be 400 nm to 700 nm, and the width W2 of the second portions 30b may be 300 nm to 600 nm.

In this regard, a ratio (W1/W2) of the width W1 of the first portions 30a to the width W2 of the second portions 30b may be 0.43 to 2.33. Such a range is determined so as to dispose the first electrodes 24 entirely within the first portion 30a and to minimize the area of the first portion 30a in consideration of width of the second electrodes 34 to be formed, alignment tolerance, and the like.

Subsequently, as illustrated in FIG. 3C, a second conductive type dopant is ion-implanted into the front surface of the semiconductor substrate 110 to form the emitter region 20. A method of forming the emitter region 20 having different doping concentrations through a single ion implantation, openings 202 and cover parts 204 of a mask 200, an ion implantation method, ion implantation energy, a distance between the semiconductor substrate 110 and the mask 200, width and pitch of the openings 202 of the mask 200, widths and pitches of the first and second portions 20a and 20b of the emitter region 20, and the like are the same or similar to the foregoing description provided with regard to the back surface field region 30 and thus a detailed description thereof will be omitted herein. However, the embodiments of the invention are not limited to the above examples and the values and the like described above with regard to the emitter region 20 and the back surface field region 30 may vary.

After ion implantation as described above, activation heat treatment may be performed. Generally, after ion implantation, the semiconductor substrate 110 is damaged or broken and thus plural lattice defects and the like occur and, accordingly, mobility of electrons or holes is reduced, and ion-implanted dopants are not positioned at a lattice position and thus inactivated. When the semiconductor substrate 110 is thermally treated in this state, the ion-implanted dopants are transferred to the lattice position and thus activated. After ion implantation for formation of the back surface field region 30, the back surface field region 30 may be subjected to activation heat treatment. Thereafter, ion implantation for formation of the emitter region 20 may be performed, followed by activation heat treatment. That is, activation heat treatment for the back surface field region 30 and the emitter region 20 may be separately performed. In another embodiment of the invention, after completing ion implantation for formation of the back surface field region 30 and ion implantation for formation of the emitter region 20, co-activation heat treatment may follow.

In addition, although it has been described that the back surface field region 30 is formed before the emitter region 20, the embodiments of the invention are not limited to the above example. That is, the emitter region 20 may be formed before the back surface field region 30.

As described above, in the embodiment of the invention, the emitter region 20 having a selective structure and the back surface field region 30 having a selective structure are formed through a single ion implantation and thus the solar cell 100 with excellent characteristics may be manufactured at low cost.

Figure 3D:
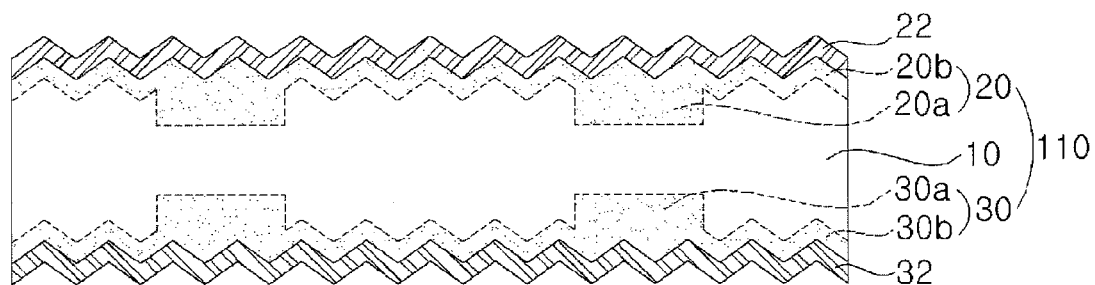

Subsequently, as illustrated in FIG. 3D, the anti-reflective film 22 and the passivation film 32 are respectively formed on the front and back surfaces of the semiconductor substrate 110.

The anti-reflective film 22 and the passivation film 32 may be formed using various methods such as vacuum deposition, chemical vapor deposition, spin-coating, screen-printing, spray coating, or the like.

Figure 3E:
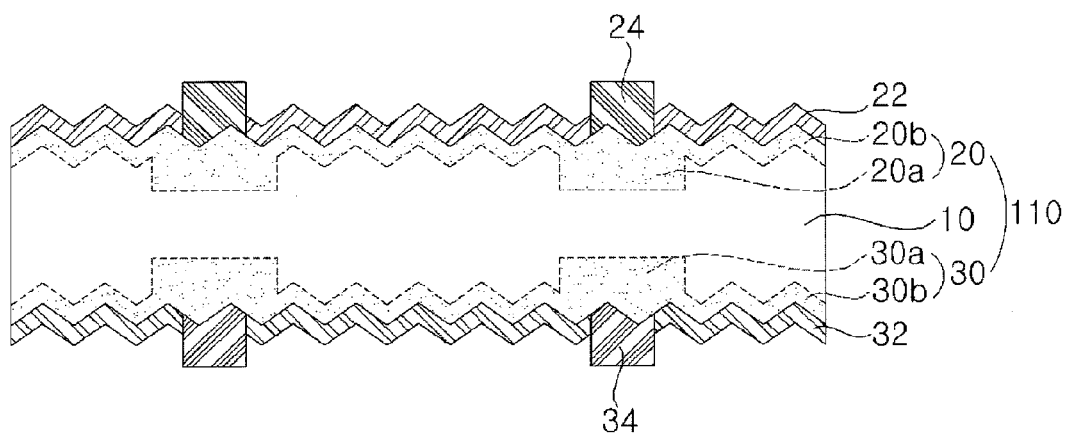

Subsequently, as illustrated in FIG. 3E, the first electrodes 24 contacting the emitter region 20 are formed on the front surface of the semiconductor substrate 110, and the second electrodes 34 contacting the back surface field region 30 are formed on the back surface of the semiconductor substrate 110.

The first electrodes 24 may be formed by forming openings in the anti-reflective film 22 and filling the openings with an electrode material by various methods such as plating, deposition, or the like. In addition, the second electrodes 34 may be formed by forming openings in the passivation film 32 and filling the openings with an electrode material by various methods such as plating, deposition, or the like.

In another embodiment of the invention, the first and second electrodes 24 and 34 having the above-described shapes may be formed by respectively coating pastes for formation of first and second electrodes 24 and 34 on the anti-reflective film 22 and the passivation film 32 by screen-printing or the like, followed by fire-through or laser firing contact. In this case, a process of separately forming openings need not be performed.

In this regard, the widths of the first and second electrodes 24 and 34 may be smaller than those of the first portions 20a and 30a. Due to this, the areas of the first and second electrodes 24 and 34 are reduced and thus optical loss may be minimized and cost reduction effects may be obtained. In addition, even though alignment tolerance occurs, the first and second electrodes 24 and 34 may entirely contact the first portions 20a and 30a, respectively. For example, a ratio of the width of the first electrodes 24 to the width of the first portion 20a and/or a ratio of the width of the second electrodes 34 to the width of the first portion 30a may be 0.2 to 0.8. When the ratios are less than 0.2, the widths of the first and second electrodes 24 and 34 are small and thus resistance may increase. On the other hand, when the ratios exceed 0.8, the first and second electrodes 24 and 34 partially contact the second portions 20b and 30b, respectively by alignment tolerance and resistance characteristics may be deteriorated. However, the embodiments of the invention are not limited to the above examples and the values described above may vary.

In the embodiment of the invention, the emitter region 20 and the back surface field region 30 are formed before the anti-reflective film 22, the passivation film 32, and the first and second electrodes 24 and 34. However, the embodiments of the invention are not limited to the above example. Thus, various modifications, such as total or partial formation of the emitter region 20 and the back surface field region 30 after or during forming at least one of the anti-reflective film 22, the passivation film 32, and the first and second electrodes 24 and 34 and the like, are possible.

In the embodiment of the invention, both the emitter region 20 and the back surface field region 30 have a selective structure, but the embodiments of the invention are not limited to the above example. Thus, any one of the emitter region 20 and the back surface field region 30 may have a selective structure and the other thereof may have another structure.

Figure 4:
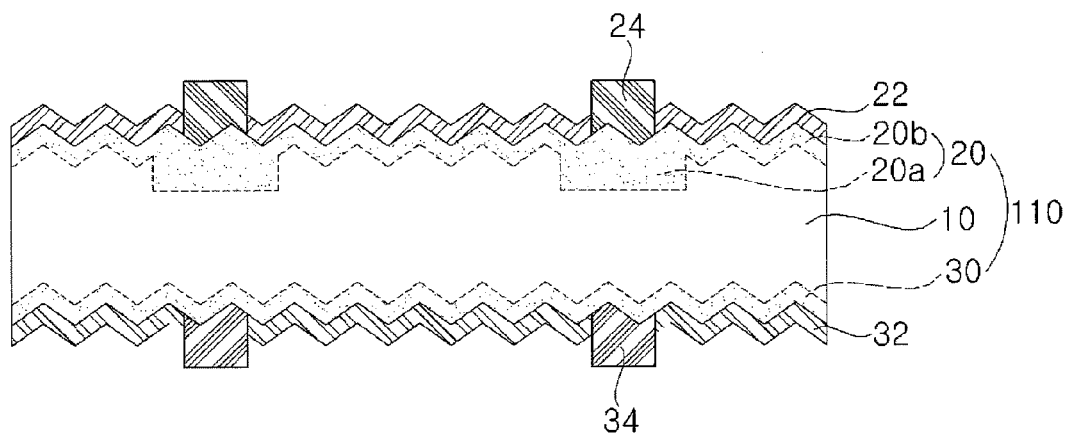
FIG. 4 is a sectional view of a solar cell according to another embodiment of the invention.
Figure 5:
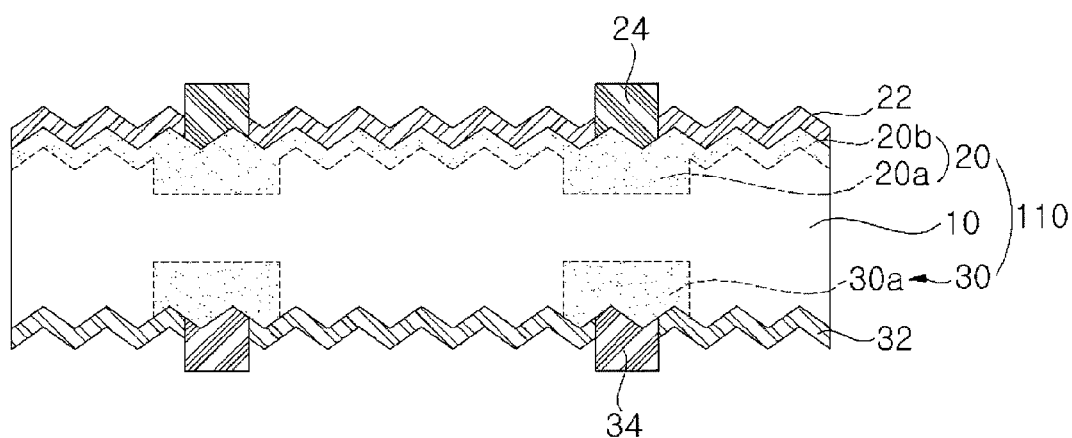
FIG. 5 is a sectional view of a solar cell according to another embodiment of the invention.
Figure 6:
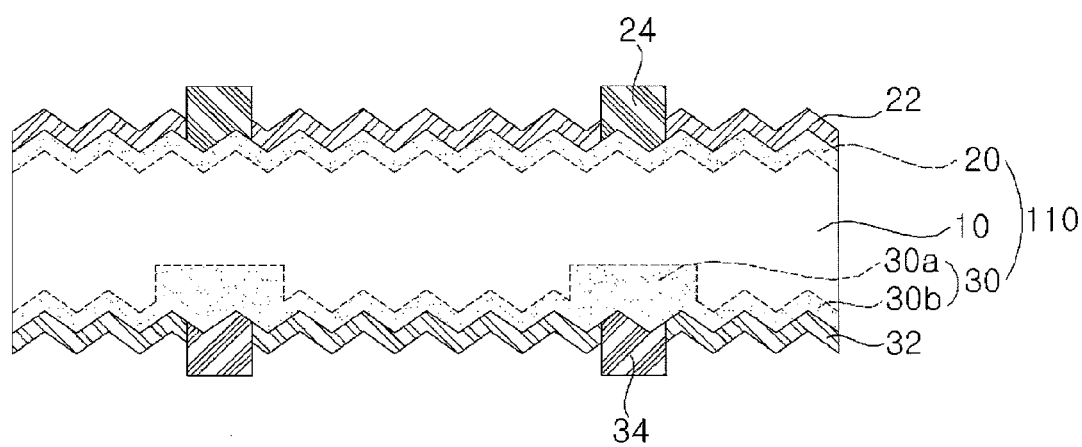
FIG. 6 is a sectional view of a solar cell according to another embodiment of the invention.

For example, the emitter region 20 may have a selective structure, and the back surface field region 30 may have a homogeneous structure as illustrated in FIG. 4 or a local structure as illustrated in FIG. 5. In this regard, the emitter region 20 may be formed by ion implantation described above. As another example, as illustrated in FIG. 6, the back surface field region 30 may have a selective structure and the emitter region 20 may have a homogeneous structure. In this regard, the back surface field region 30 may be formed by ion implantation described above.

Hereinafter, one or more embodiments of the invention will be described more fully with reference to the following examples. However, these examples are provided for illustrative purposes only and are not intended to limit the scope of the embodiments of the invention.

EXPERIMENTAL EXAMPLE

Phosphorus (P) was ion-implanted into an n-type semiconductor substrate by plasma ion implantation in a state in which a mask including openings and cover parts was positioned thereon, thereby forming a back surface field region. In this regard, the mask was spaced 4 mm apart from the semiconductor substrate and ion implantation energy was 20 KeV.

Comparative Example 1

A back surface field region was formed in the same manner as in the Experimental Example, except that a mask was not used. Thus, the back surface field region had a homogeneous structure.

Comparative Example 2

The same n-type semiconductor substrate as that used in the Experimental Example was prepared.

Figure 7:
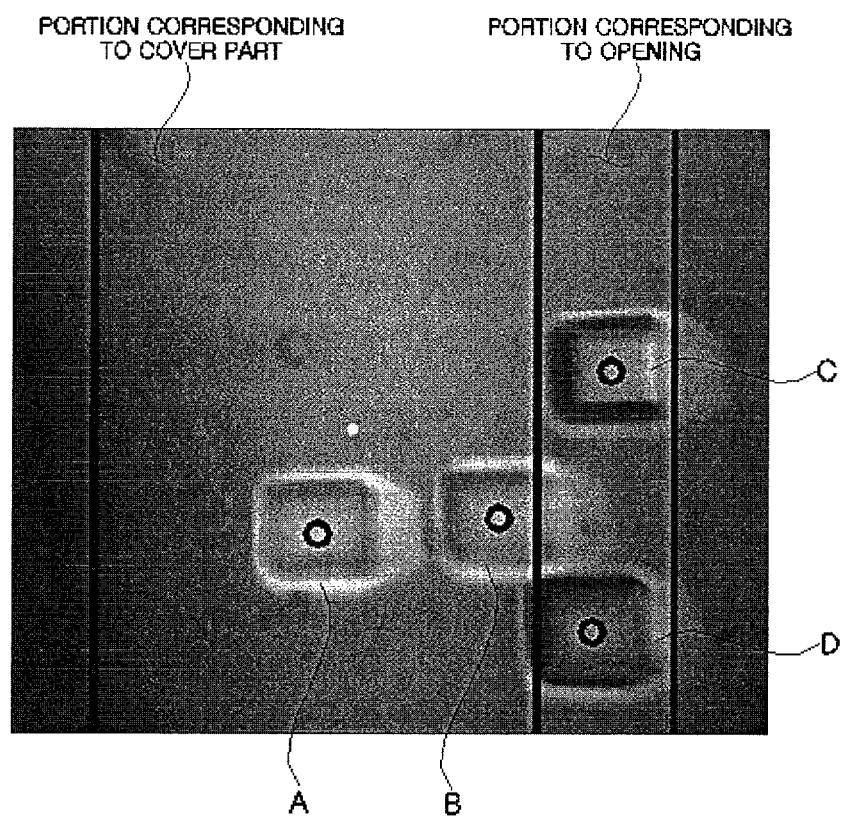
FIG. 7 is an image of a semiconductor substrate including a back surface field region formed according to an Experimental Example.

An image of a semiconductor substrate including the back surface field region formed according to the Experimental Example is shown in FIG. 7. Doping concentrations of portions A to D of FIG. 7 according to depth from the semiconductor substrate were measured and results of comparison among the measurement result of FIG. 7 and measurement results of Comparative Examples 1 and 2 are illustrated in FIG. 8.

Figure 8:
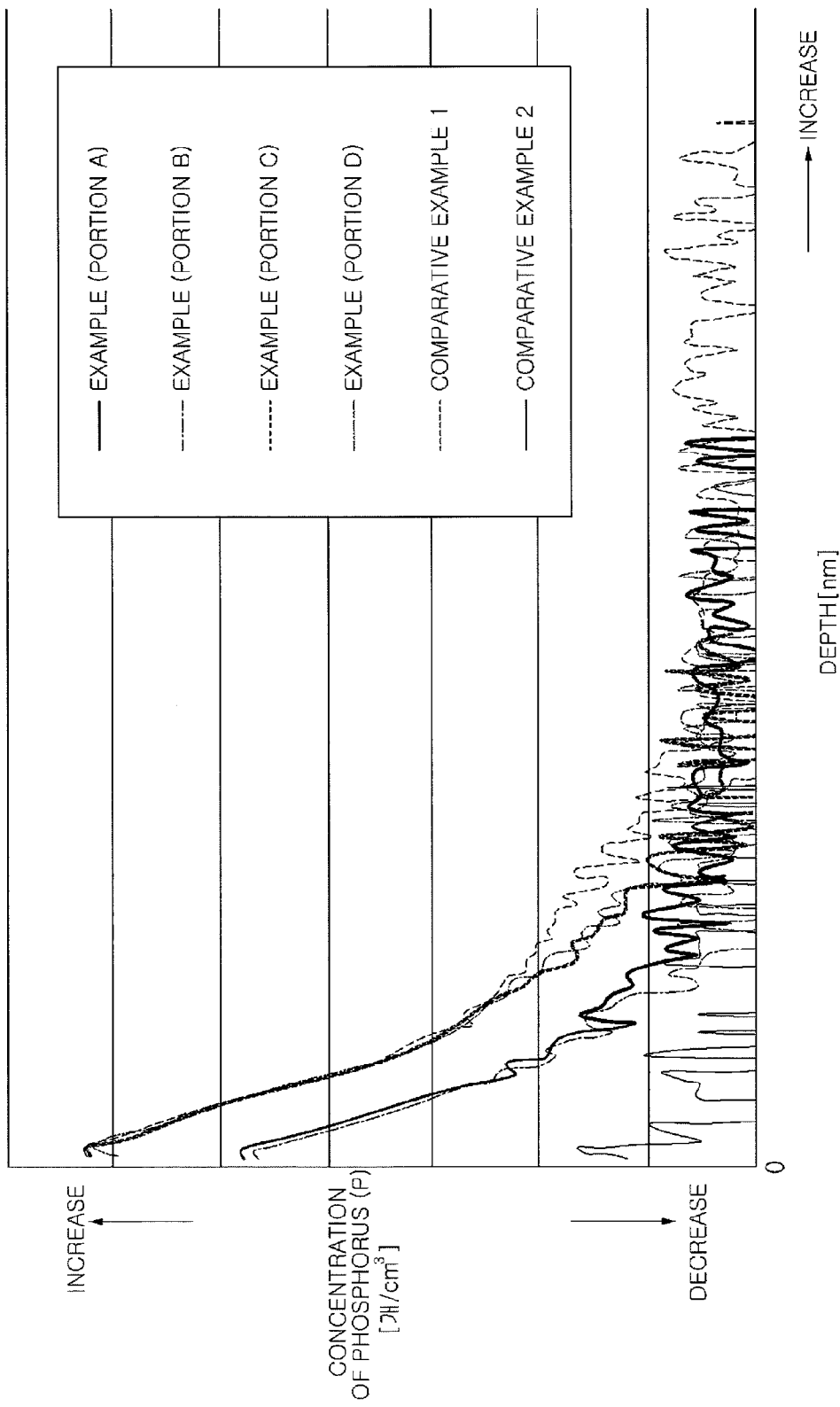
FIG. 8 is a graph showing comparison among measurement results of doping concentrations of portions A to D of FIG. 7 according to depth from the semiconductor substrate and measurement results of Comparative Examples 1 and 2.

Referring to FIG. 8, it can be confirmed that portions A and B corresponding to the cover parts of Experimental Example have a higher doping concentration than portions C and D corresponding to the openings. In this regard, it can be confirmed that portions A and B have a higher doping concentration than that in Comparative Example 2 in which doping was not performed, and portions C and D have a similar doping concentration to that in Comparative Example 1 in which the back surface field region having a homogeneous structure was formed. That is, portions A and B correspond to first portions having a relatively high doping concentration and portions C and D correspond to second portions having a relatively low doping concentration.

Thus, according to the Experimental Example, it can be confirmed that a back surface field region having a selective structure is easily formed through a single ion implantation.

Particular characteristics, structures, or effects described in connection with the embodiment of the invention are included in at least one embodiment of the invention and not necessarily in all embodiments of the invention. Furthermore, the particular characteristics, structures, or effects of any specific embodiment of the invention may be combined in any suitable manner with one or more other embodiments of the invention or may be changed by those skilled in the art to which the embodiments of the invention pertain. Therefore, it is to be understood that contents associated with such combination or change fall within the spirit and scope of the embodiments of the invention.

Although embodiments of the invention have been described with reference to a number of illustrative embodiments of the invention, it should be understood that numerous other modifications and applications may be devised by those skilled in the art that will fall within the intrinsic aspects of the embodiments of the invention. More particularly, various variations and modifications are possible in concrete constituent elements of the embodiments of the invention. In addition, it is to be understood that differences relevant to the variations and modifications fall within the spirit and scope of the embodiments of the invention defined in the appended claims.

What is claimed is:

1. A method of manufacturing a solar cell, the method comprising:
    forming a doping region comprising first and second portions having different doping concentrations by ion-implanting a dopant into a semiconductor substrate; and
    forming an electrode connected to the doping region,
    wherein, in the forming of the doping region, the first and second portions are simultaneously formed by the same process using a mask that is spaced apart from the semiconductor substrate,
    wherein, in the forming of the doping region, the first and second portions are simultaneously formed through a single ion implantation,
    wherein, in the forming of the doping region, ions of the dopant are implanted in a state in which the mask comprising an opening to expose a region corresponding to the first portion and a cover part to cover a region corresponding to the second portion is positioned on the semiconductor substrate at a distance,
    wherein the ions of the dopant are implanted into the semiconductor substrate by passing through the opening and spreading out from the opening,
    wherein the ions of the dopant having passed through the opening are implanted into the first portion of the semiconductor substrate, the ions of the dopant having passed through the opening are partially implanted into the second portion of the semiconductor substrate by spreading outside of the opening, and
    wherein the first portion has a relatively high doping concentration than the second portion.

2. The method according to claim 1, wherein the opening comprises a plurality of openings, and
    wherein, in the forming of the doping region, when a distance between the plurality of openings is denoted as a first distance, the ions of the dopant having passed through each opening spread out from the plurality of openings while moving from the plurality of openings toward the semiconductor substrate by half the first distance or a greater distance than the half the first distance.

3. The method according to claim 1, wherein, in the forming of the doping region, the opening comprises first and second openings adjacent to each other, and
    wherein the ions of the dopant spreading out of the first opening and the ions of the dopant spreading out of the second opening overlap with each other at the semiconductor substrate to form an overlapping area in the semiconductor substrate.

4. The method according to claim 1, wherein, in the forming of the doping region, the first portion is formed at a portion of the semiconductor substrate corresponding to the opening so as to have a first doping concentration, and the second portion is formed at a portion of the semiconductor substrate corresponding to the cover part so as to have a second doping concentration that is lower than the first doping concentration.

5. The method according to claim 1, wherein, in the forming of the doping region, when the ions of the dopant are implanted, ion implantation energy of the ions of the dopant is 3 KeV to 20 KeV.

6. The method according to claim 1, wherein, in the forming of the doping region, the ions of the dopant are implanted by plasma ion implantation.

7. The method according to claim 1, wherein, in the forming of the doping region, the distance between the semiconductor substrate and the mask is 4 mm to 8 mm.

8. The method according to claim 1, wherein the opening has the same or smaller width than the cover part.

9. The method according to claim 8, wherein a ratio of the width of the opening to the width of the cover part is 0.18 to 1.00.

10. The method according to claim 1, wherein the opening has a width of 150 nm to 500 nm, and the cover part has a width of 500 nm to 850 nm.

11. The method according to claim 1, wherein the first portion has a doping concentration of $2.0 \times 10^{19}/cm^3$ to $5.0 \times 10^{19}/cm^3$ and a width of 300 nm to 700 nm, and the second portion has a doping concentration of $1.0 \times 10^{18}/cm^3$ to $2.0 \times 10^{19}/cm^3$ and a width of 300 nm to 700 nm.

12. The method according to claim 11, wherein a ratio of the width of the first portion to the width of the second portion is 0.43 to 2.33.

13. The method according to claim 1, wherein the doping region is at least one of an emitter region and a back surface field region.

14. A method of forming a doping region of a solar cell, the method comprising:
 simultaneously forming first and second portions having different doping concentrations by ion-implanting a dopant into a semiconductor substrate by the same process using a mask that is spaced apart from the semiconductor substrate,
 wherein, in the forming of the doping region, the first and second portions are simultaneously formed through a single ion implantation,
 wherein in the forming of the doping regions of the do s ant are implanted in a state in which the mask comprising an opening to expose a region corresponding to the first portion and a cover part to cover a region corresponding to the second portion is positioned on the semiconductor substrate at a distance,
 wherein the ions of the dopant are implanted into the semiconductor substrate by passing through the opening and spreading out from the opening,
 wherein the ions of the dopant having passed through the opening are implanted into the first portion of the semiconductor substrate, the ions of the dopant having passed through the opening are partially implanted into the second portion of the semiconductor substrate by spreading outside of the opening, and
 wherein the first portion has a relatively high doping concentration than the second portion.

15. The method according to claim 14, wherein, when the ions of the dopant are implanted, ion implantation energy of the ions of the dopant is 3 KeV to 20 KeV.

16. The method according to claim 14, wherein the distance between the semiconductor substrate and the mask is 4 mm to 8 mm.

* * * * *